(12) United States Patent
Bulovic et al.

(10) Patent No.: US 6,844,608 B2
(45) Date of Patent: Jan. 18, 2005

(54) REVERSIBLE FIELD-PROGRAMMABLE ELECTRIC INTERCONNECTS

(75) Inventors: Vladimir Bulovic, Cambridge, MA (US); Aaron Mandell, Boston, MA (US); Andrew Perlman, Boston, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/139,381

(22) Filed: May 7, 2002

(65) Prior Publication Data

US 2002/0163057 A1 Nov. 7, 2002

Related U.S. Application Data

(60) Provisional application No. 60/289,061, filed on May 7, 2001.

(51) Int. Cl.[7] .......................... G01N 27/02; H01L 29/00
(52) U.S. Cl. .................... 257/529; 257/209; 422/82.02; 438/600; 438/601; 438/281
(58) Field of Search ........................... 438/99, 101, 33, 438/281, 600, 601; 422/82.01, 82.02; 257/209, 529, 530

(56) References Cited

U.S. PATENT DOCUMENTS

| | | | |
|---|---|---|---|
| 3,719,933 | A | 3/1973 | Wakabayashi et al. |
| 3,810,127 | A | 5/1974 | Hoff, Jr. |
| 4,267,558 | A | 5/1981 | Guterman |
| 4,267,583 | A | 5/1981 | Suzuki |
| 4,371,883 | A | 2/1983 | Potember et al. |

(List continued on next page.)

FOREIGN PATENT DOCUMENTS

| | | |
|---|---|---|
| DE | 196 40 239 A1 | 4/1998 |
| DE | 199 59 904 A1 | 6/2001 |
| EP | 0 268 370 A3 | 5/1988 |
| EP | 0 268 370 A2 | 5/1988 |
| EP | 0 385 688 A2 | 9/1990 |

(List continued on next page.)

OTHER PUBLICATIONS

"A Disrupted Organic Film: Could Memories Be Made of This?," *ORNL Review*, vol. 33, No. 2, 2000.

"Technical Summary of Programmable Metallization Cell Memory Technology," Version 1.3, Dec. 2001.

"The 1998 Conference Archive," *The Sixth Foresight Conference on Molecular Nanotechnology*, Nov. 12–15, 1998, www.foresight.org/Conferences/MNT6/index.html.

Beck, A. et al., "Reproducible Switching Effect in Thin Oxide Films for Memory Applications," *Applied Physics Letters*, vol. 77, No. 1, pp. 139–141, Jul. 3, 2000.

Bernard, Allen, "A Big Name in Chips Helps Coatue in Molecular Memory Race," Aug. 27, 2000, www.nanoelectronicsplanet.com/features/article/0,4028,6571–1452831,00.html.

(List continued on next page.)

*Primary Examiner*—Ha Tran Nguyen
(74) *Attorney, Agent, or Firm*—Amin & Turocy, LLP (57) ABSTRACT

A programmable interconnect structure and method of operating the same provides a programmable interconnection between electrical contacts. The interconnect includes material that has a reversibly programmable resistance. The material includes a molecular matrix with ionic complexes distributed through the molecular matrix. Application of an electrical field or electric current causes the molecular composite material to assume a desired resistivity (or conductivity) state. This state is retained by the molecular composite material to thus form a conductive or a non-conductive path between the electrical contacts.

22 Claims, 4 Drawing Sheets

U.S. PATENT DOCUMENTS

| | | | |
|---|---|---|---|
| 4,616,340 A | | 10/1986 | Hayashi et al. |
| 4,631,562 A | | 12/1986 | Avery |
| 4,652,894 A | | 3/1987 | Potember et al. |
| 4,677,742 A | | 7/1987 | Johnson |
| 4,727,514 A | | 2/1988 | Bhuva et al. |
| 4,733,375 A | | 3/1988 | Terashima |
| 4,834,911 A | | 5/1989 | Carew |
| 4,839,700 A | * | 6/1989 | Ramesham et al. |
| 4,860,254 A | | 8/1989 | Pott et al. |
| 5,012,445 A | | 4/1991 | Kazuaki et al. |
| 5,034,192 A | | 7/1991 | Wrighton et al. |
| 5,130,380 A | | 7/1992 | Carew |
| 5,136,212 A | | 8/1992 | Eguchi et al. |
| 5,153,681 A | | 10/1992 | Kishimoto et al. |
| 5,196,912 A | | 3/1993 | Matsumoto et al. |
| 5,206,525 A | | 4/1993 | Yamamoto et al. |
| 5,245,543 A | | 9/1993 | Smayling et al. |
| 5,296,716 A | | 3/1994 | Ovshinsky et al. |
| 5,315,131 A | | 5/1994 | Kishimoto et al. |
| 5,319,564 A | | 6/1994 | Smayling et al. |
| 5,355,235 A | | 10/1994 | Nishizawa et al. |
| 5,392,236 A | | 2/1995 | Hashimoto |
| 5,412,614 A | | 5/1995 | Bird |
| RE34,974 E | | 6/1995 | Terashima |
| 5,431,883 A | | 7/1995 | Barraud |
| 5,440,518 A | | 8/1995 | Hazani |
| 5,563,081 A | | 10/1996 | Ozawa |
| 5,572,472 A | | 11/1996 | Kearney et al. |
| 5,579,199 A | | 11/1996 | Kawamura et al. |
| 5,670,818 A | | 9/1997 | Forouhi et al. |
| 5,691,935 A | | 11/1997 | Douglass |
| 5,698,874 A | | 12/1997 | Hayashi |
| 5,734,605 A | | 3/1998 | Zhu et al. |
| 5,761,115 A | | 6/1998 | Kozicki et al. |
| 5,770,885 A | | 6/1998 | McCollum et al. |
| 5,818,749 A | | 10/1998 | Harshfield |
| 5,849,403 A | | 12/1998 | Aoki et al. |
| 5,869,882 A | | 2/1999 | Chen et al. |
| 5,896,312 A | | 4/1999 | Kozicki et al. |
| 5,900,662 A | | 5/1999 | Frisina et al. |
| 5,914,893 A | | 6/1999 | Kozicki et al. |
| 6,055,180 A | | 4/2000 | Gudesen et al. |
| 6,060,338 A | | 5/2000 | Tanaka et al. |
| 6,064,589 A | | 5/2000 | Walker |
| 6,088,319 A | | 7/2000 | Gudesen |
| 6,118,684 A | | 9/2000 | Yihong et al. |
| 6,128,214 A | | 10/2000 | Kuekes et al. |
| 6,150,705 A | | 11/2000 | Chen |
| 6,288,697 B1 | | 9/2001 | Eto et al. |
| 6,292,396 B1 | | 9/2001 | Tailliet |
| 6,326,936 B1 | | 12/2001 | Inganas et al. |
| 6,349,054 B1 | | 2/2002 | Hidaka |
| 6,353,559 B2 | | 3/2002 | Hasegawa et al. |
| 6,384,427 B1 | | 5/2002 | Yamazaki et al. |
| 6,403,396 B1 | | 6/2002 | Gudesen et al. |
| 6,403,397 B1 | | 6/2002 | Katz |
| 6,407,953 B1 | | 6/2002 | Cleeves |
| 6,418,049 B1 | | 7/2002 | Kozicki et al. |
| 6,424,553 B2 | | 7/2002 | Berggren et al. |
| 6,426,891 B1 | | 7/2002 | Katori |
| 6,429,457 B1 | | 8/2002 | Berggren et al. |
| 6,432,739 B1 | | 8/2002 | Gudesen et al. |
| 6,449,184 B2 | | 9/2002 | Kato et al. |
| 6,459,095 B1 | | 10/2002 | Heath et al. |
| 6,461,916 B1 | | 10/2002 | Adachi et al. |
| 6,487,106 B1 | | 11/2002 | Kozicki |
| 2001/0014038 A1 | | 8/2001 | Hasegawa et al. |
| 2001/0054709 A1 | | 12/2001 | Heath et al. |
| 2001/0055384 A1 | | 12/2001 | Yamazaki et al. |
| 2002/0027819 A1 | | 3/2002 | Tomanek et al. |
| 2002/0101763 A1 | | 8/2002 | Hosogane et al. |
| 2002/0104889 A1 | | 8/2002 | Forrest et al. |
| 2002/0125504 A1 | | 9/2002 | Perlov et al. |
| 2002/0134979 A1 | | 9/2002 | Yamazaki et al. |
| 2002/0163030 A1 | | 11/2002 | Mandell et al. |
| 2002/0163057 A1 | | 11/2002 | Bulovic et al. |
| 2002/0163828 A1 | | 11/2002 | Krieger et al. |
| 2002/0163829 A1 | | 11/2002 | Bulovic et al. |
| 2002/0163830 A1 | | 11/2002 | Bulovic et al. |
| 2002/0163831 A1 | | 11/2002 | Krieger et al. |
| 2002/0168820 A1 | | 11/2002 | Kozicki et al. |

FOREIGN PATENT DOCUMENTS

| | | |
|---|---|---|
| EP | 0 727 822 A2 | 8/1996 |
| JP | 7-106440 | 4/1995 |
| RU | 2071126 C1 | 12/1996 |
| WO | WO 93/04506 A1 | 3/1993 |
| WO | WO 99/04440 A1 | 1/1999 |
| WO | WO 99/08325 A2 | 2/1999 |
| WO | WO 99/14762 A1 | 3/1999 |
| WO | WO 99/19900 A2 | 4/1999 |
| WO | WO 00/26918 A1 | 5/2000 |
| WO | WO 00/48196 A1 | 8/2000 |
| WO | WO 02/35580 A2 | 5/2002 |
| WO | WO 02/37500 A1 | 5/2002 |
| WO | WO 02/43071 A1 | 5/2002 |
| WO | WO 02/078003 A2 | 10/2002 |
| WO | WO 02/091384 A1 | 11/2002 |
| WO | WO 02/091385 A1 | 11/2002 |
| WO | WO 02/091476 A1 | 11/2002 |
| WO | WO 02/091494 A1 | 11/2002 |
| WO | WO 02/091495 A2 | 11/2002 |
| WO | WO 02/091496 A2 | 11/2002 |
| WO | WO 03/017282 A1 | 2/2003 |

OTHER PUBLICATIONS

Chen, J. et al., "Room–temperature Negative Differential Resistance in Nanoscale Molecular Junctions," *Applied Physics Letters*, vol. 77, No. 8, Aug. 21, 2000.

Collier, C. P. et al., "Electrically Configurable Molecular–Based Logic Gates," *Science*, vol. 285, pp. 391–394, Jul. 16, 1999.

Gannon, Andrew, "Toward the Next Generation CD," *Physical Review Focus*, Feb. 16, 2000.

Gao, H. .J. et al., "Reversible, Nanometer–Scale Conductance Transitions in an Organic Complex," *Physical Review Letters*, vol. 84, No. 8, pp. 1780–1783, Feb. 21, 2000.

Gao, H. .J. et al., "Using a New Kind of Organic Complex System of Electrical Bistability for Ultrahigh Density Data Storage," J. Vac. Sci. Technol. B vol. 15, No. 4, pp. 1581–1583, Jul./Aug. 1997.

International Search Report, PCT/RU01/00334, search completed Feb. 14, 2002.

International Search Report, PCT/US02/14236, search completed Aug. 14, 2002.

International Search Report, PCT/US02/14237, search completed Sep. 9, 2002.

International Search Report, PCT/US02/14238, search completed Aug. 9, 2002.

International Search Report, PCT/US02/14239, search completed Aug. 20, 2002.

International Search Report, PCT/US02/14269, search completed Mar. 27, 2003.

International Search Report, PCT/US02/14270, search completed Mar. 28, 2003.

Japanese patent abstract of publication No. 01–103137, Apr. 20, 1989.

Japanese patent abstract of publication No. 01278781, Nov. 9, 1989.

Japanese patent abstract of publication No. 61107723, May 26, 1986.

Japanese patent abstract of publication No. 63293729, Nov. 30, 1998.

Krieger, Ju. H. et al., "Molecular Analogue Memory Cell Based on Electrical Switching and Memory in Molecular Thin Films," *Synthetic Metals*, 7730 (2000), pp. 1–4.

Krieger, Juri H. et al., "Molecular Analogue Memory Cell," *Sixth Foresight Conference on Molecular Nanotechnology*, Santa Clara, California, Nov. 12–15, 1998.

Krieger, Yu. G. et al., "Study of Test Structures of a Molecular Memory Element," *Institute of Inorganic Chemistry*, Siberian Branch, Russian Academy of Sciences. Translated from *Zhurnal Strukturnoi Khimii*, vol. 34, No. 6, pp. 152–156, Nov.–Dec. 1993. Original article submitted Apr. 27, 1993.

Krieger, Yu. G., "Molecular Electronics: Current State and Future Trends," *Journal of Structural Chemistry*, vol. 34, No. 6, pp. 896–904, Nov.–Dec. 1993.

Krieger, Yu. H., "Structural Instability of One–Dimensional Systems as a Physical Principle Underlying the Functioning of Molecular Electronic Devices," *Journal of Structural Chemistry*, vol. 40, No. 4, pp. 594–619, Jul.–Aug. 1999.

Kurita, Ryo et al., "Field Modulation Effects on Charge–Density–Wave Conduction in $NbSe_j$," *Physica B*, 284–288 (2000), pp. 1161–1662.

Ma, L. P. et al., "Data Storage With 0.7 nm Recording Marks on a Crystalline Organic Thin Film by a Scanning Tunneling Microscope," *Applied Physics Letters*, vol. 73, No. 6, pp. 850–852, Aug. 10, 1998.

Ma, L. P. et al., "Nanometer–Scale Recording on an Organic Complex Thin Film With a Scanning Tunneling Microscope," *Applied Physics Letters*, vol. 69, No. 24, pp. 3752–3753, Dec. 9, 1996.

Machida, Yasuhiko et al., "Electrical Switching in Evaporated Lead Phthalocyanine Films," *Japanese Journal of Applied Physics*, vol. 28, No. 2, pp. 297–298, Feb. 1989.

Ovshinsky, Stanford R., "Localized States in the Gap of Amorphous Semiconductors," *Physical Review Letters*, vol. 36, No. 24, pp. 1469–1472, Jun. 14, 1976.

Potember, R. S. et al., "Electrical Switching and Memory Phenomena in Cu–TCNQ Thin Films," *Applied Physics Letters*, vol. 34, No. 6, pp. 405–407, Mar. 15, 1979.

Reed, M.A. et al., "Molecular Random Access Memory Cell," *Applied Physics Letters*, vol. 78, No. 23, pp. 3735–3737, Jun. 4, 2001.

Rossel, C. et al., "Electrical Current Distribution Across a Metal–Insulator–Metal Structure During Bistable Switching," Apr. 24, 2001.

Rotman, David, "Molecular Memory," *Technology Review*, May 2001.

*Semiconductor Times*, pp. 5–6, Jul. 2002.

Stikeman, Alexandra, "Polymer Memory: The Plastic Path to Better Data Storage," *Technology Review*, p. 31, Sep. 2002.

Zhou, C. et al., "Nanoscale Metal/Self–Assembled Monolayer/Metal Heterostructures," *Applied Physics Letters*, vol. 71, No. 5, pp. 611–613, Aug. 4, 1997.

* cited by examiner

REVERSIBLE FIELD-PROGRAMMABLE ELECTRIC INTERCONNECTS

RELATED APPLICATIONS

U.S. Provisional Patent Application Ser. No. 60/289,061, filed on May 7, 2001, entitled "Reversibly Field-Programmable Electric Interconnects".

FIELD OF THE INVENTION

The present invention relates to programmable integrated circuit structures, and more particularly, to routing structures incorporating composite materials having an electrically programmable resistivity.

BACKGROUND OF THE INVENTION

Programmable semiconductor devices include programmable read only memories ("PROMs"), programmable logic devices ("PLDs"), and programmable gate arrays. Programmable elements suitable for one or more of these device types include so-called "fuses" and "antifuses".

A "fuse" is a structure which electrically couples a first terminal to a second terminal, but which, when programmed by passage of sufficient current between its terminals, electrically decouples the first terminal from the second terminal. A fuse typically consists of a conductive material which has a geometry that causes portions of the conductive fuse material to physically separate from each other to produce an open circuit when the fuse is heated to a given extent.

An "antifuse" is a structure, which when un-programmed, does not electrically couple its first and second terminals, but which, when programmed by applying sufficient voltage between the first and second terminals, permanently electrically connects the first and second terminals. One type of antifuse includes a highly resistive material between two terminals of conductive material, which when heated by an electric current, heats the materials and causes portions of the conductive material to extend into the resistive material and form a permanent conductive path. Another type of antifuse can be made of amorphous silicon which forms conductive polysilicon when heated. Fuses and antifuses have in common that their respective conductive state, once changed, cannot be reversed to again assume the initial state.

It would therefore be desirable to provide a connection between terminals, for example, of an integrated circuit, that can be programmed to switch between different conductive states in a reversible manner, i.e., that can operate reversibly both as fuses and as antifuses.

SUMMARY OF THE INVENTION

These and other needs are met by embodiments of the present invention which provide a semiconductor device comprising a first electrical contact, a second electrical contact, and an interconnect between the first and second electrical contacts. The interconnect has a reversibly programmable resistance. In certain embodiments of the invention, the interconnect consists of a molecular matrix, and in further embodiments, ionic complexes are distributed through the molecular matrix. These ionic complexes are dissociable in the molecular matrix under the influence of an applied electrical field.

The use of an interconnect with a reversibly programmable resistance allows an integrated circuit to be programmed in a fully reversible manner. Thus, fuses and anti-fuses can be replaced by the reversible interconnect of the present invention within integrated circuits.

In other aspects of the invention, the earlier stated needs are also met by providing a programmable interconnect structure comprising first and second electrical contacts, and an interconnect between the first and second electrical contacts. The interconnect comprises a material that has reversibly programmable resistivity, the material comprising molecular matrix, and in certain embodiments, ionic complexes are distributed through the molecular matrix.

The earlier stated needs are also met by a method of electrically connecting and disconnecting electrical contacts in a circuit by programming of an electrical interconnect between electrical contacts, in accordance with the embodiments of the present invention. The steps include selectively applying a first electrical field or a first current to the electrical interconnect to program the electrical interconnect to assume a first state of conductivity to electrically connect the electrical contacts through the electrical interconnect. The steps also include selectively applying a second electrical field or second current to the electrical interconnect to program the electrical interconnect to assume a second state of conductivity to electrically isolate the electrical contacts through the electrical interconnect. The electrical interconnect comprises a material that has a reversibly programmable conductivity. The material comprises a molecular matrix. In certain embodiments, ionic complexes are distributed through the molecular matrix.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the programming of integrated circuit structures, which have in the past been limited to fuses and anti-fuses that may be programmed only in a single direction. The present invention overcomes these problems in part, by the provision of an electrical interconnect between electrical contacts, with the interconnect having a reversibly programmable resistance. By programming the resistance, an electrical connection may be made between the electrical contacts, or the contacts may be electrically isolated from each other. The programmable resistance is provided by the interconnect which is made of a molecular matrix with ionic complexes distributed through the molecular matrix. These ionic complexes are dissociable in the molecular matrix under the influence of an applied electrical field.

Figure 1:
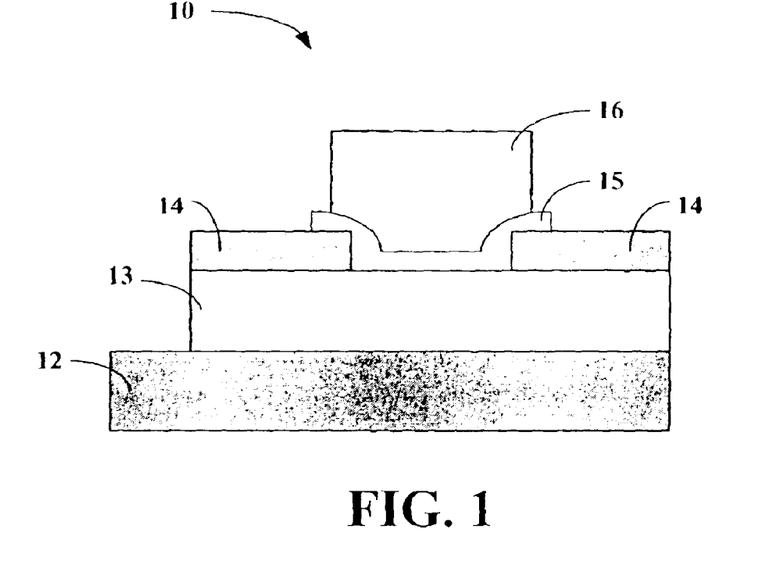
FIG. 1 is a cross-sectional view of a programmable interconnect structure in accordance with an embodiment of the present invention.

Referring now to FIG. 1, a circuit 10 with a programmable interconnect structure, shown here in cross-section, includes a substrate (not shown), a dielectric layer 12, a first conductive layer 13, a second conductive layer 16, a dielectric layer 14 with a via hole, and an interconnect layer 15 having a reversibly programmable resistance and extending into the via hole, contacting both the first conductive layer 13 and the second conductive layer 16. The first dielectric layer 12 can be patterned to expose the substrate (not shown) or device features of devices fabricated on the substrate. Programmable interconnects may be formed in certain ones of the via holes of the integrated circuit and not in other via holes.

Figure 2:
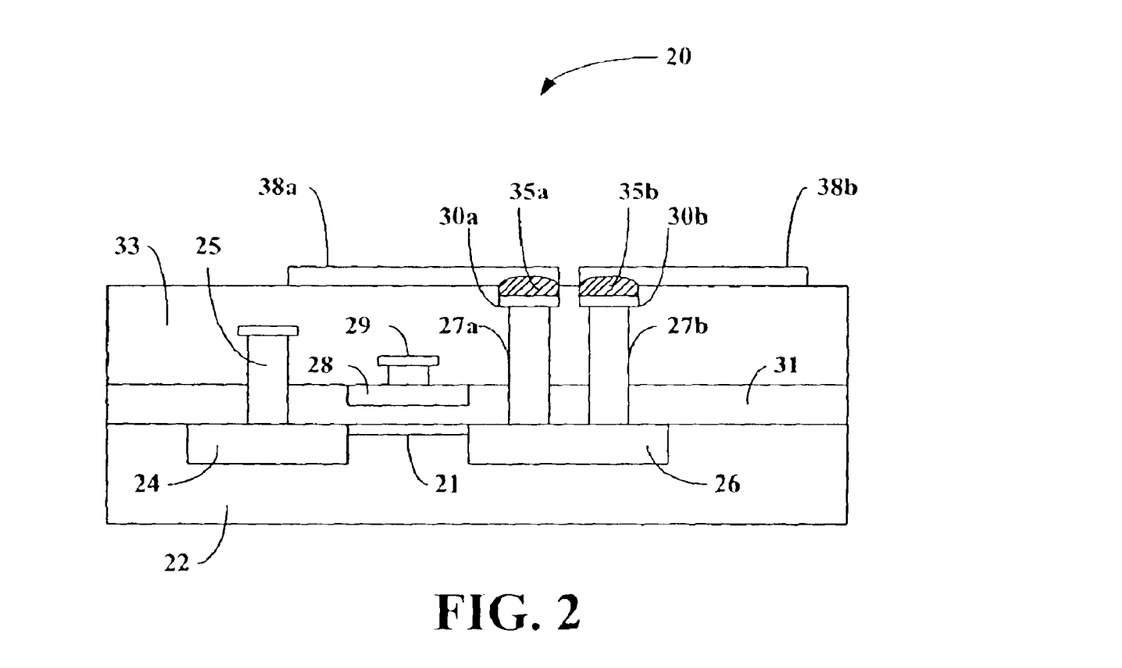
FIG. 2 is a cross-sectional view of a programmable interconnect structure in accordance with another embodiment of the present invention.

Referring now to FIG. 2, an exemplary FET device structure 20 with optional connections of a drain 26 to two different remote devices (not shown) is formed on a substrate 22, such as a semiconducting or p-type Si, using standard Si processing. Conventional metallization 25, 27, 29 is provided to form contacts to the circuitry. The metallization 25, 27, 29 extends through dielectric insulating layers 31, 33 comprising $SiO_2$ or $Si_3N_4$, for example. Copper, aluminum or other suitable materials may be employed for the metallization.

The FET 20 has source and drain regions 24, 26 and a gate 28 insulated by a gate oxide 31. The conductive channel of the FET 20 is indicated by the reference numeral 21. As seen from FIG. 2, electrical contact to one terminal 26 of the exemplary FET 20 is provided from the top surface by way of two conductive plugs 27a, 27b extending through via holes provided in the top insulating layer 33, e.g., a field oxide. The via holes filled with the conductive plugs 27a, 27b are terminated with respective contact pads 30a, 30b, which can be recessed with respect to the top surface of insulating layer 33, as also shown in FIG. 2. As will be recognized by those skilled in the art, the FET source 24 and gate 28 can be connected in a similar manner.

A molecular composite material having a programmable electrical resistance is applied to the top surface of insulating layer 33 by conventional deposition techniques, such as spin coating, or evaporation, for example. The molecular composite material has the property of preferably adhering to the exposed conductive metal pads 30a, 30b, but not to the surface of the insulating $SiO_2$ or $Si_3N_4$ layer 33. The molecular composite material hence can form respective two-terminal resistance elements 35a, 35b whose linear dimensions are defined by the size of the conductive pads 30a, 30b, with the thickness of the two-terminal elements 35a, 35b being controlled by the deposition condition (e.g., the spinning speed or evaporation rate) of the molecular composite material.

An exemplary suitable molecular composite material will be described below. The molecular composite material can be deposited at a low temperature which can be considerably lower than temperatures employed in traditional Si processing. Metal or semiconductor layers 38a, 38b (e.g., Al or poly-Si) can then be selectively applied to the top surface of the two-terminal elements 35a, 35b to provide an electrical connection to another component or device of the device structure 20.

The reversibly programmable two-terminal elements 35a, 35b have the advantage over conventional fuses and antifuses in that their resistance can be reversibly changed back and forth between a high-resistance state ("off") and a low-resistance state ("on").

An exemplary molecular composite material that can be used for fabricating the two-terminal elements 35a, 35b is shown in FIGS. 3a–d. A number of different materials may be used as the molecular composite material. Exemplary materials are described below, but are also discussed in an article by Yu H. Krieger, entitled, "Structural Instability of One-Dimensional Systems As A Physical Principle Underlying The Functioning of Molecular Electronic Devices", Journal of Structural Chemistry, Vol. 40, No. 4, 1999 (Yu H. Krieger), expressly incorporated by reference herein.

There are two predominant types of structural organization of such systems. First, there are strands of linear conjugated polymers, which are weakly bonded to each other and whose mutual arrangement is generally poorly organized. Second, there are crystal structures, where the individual molecules form one-dimensional columns and interact with each other much more actively than molecules from different columns do.

Polyconjugated systems primarily involve polyvinylenes, i.e., polymers with an acyclic conjugation system, in which the one-dimensional character of structure is dictated by the mechanism of conjugation in linear macromolecules. Polyacetylene is a classical representative of this class of polymers. Its electronic structure is a prototype for many other conjugated polymers.

Another wide class of molecular compounds are formed from aromatic and heterocyclic molecules which possess high electric conductivity due to $\pi$-bonds between molecules. Such molecular systems are called $\pi$-complexes or charge transfer complexes, with those systems whose structure involves isolated one-dimensional columns or strands possessing pronounced electro-physical properties of interest for switching and memory applications. Molecular charge transfer complexes are donor-acceptor systems formed from two molecules: one possessing donor and another acceptor properties. Among the well-defined complexes with a one-dimensional structure, tetra-cyano-quinodimethane (TCNQ) are planar molecules with unsaturated bonds, arranged in a crystal as parallel stacks forming a quasi-one-dimensional system.

In another class of one-dimensional systems, the cations are dynamically disordered. It involves molecular compounds having the general formula $(TMTSF)_2X$. Transition metal salts of $K_2 Pt(CN)_4 Br_{0.3}x\ 3H_2O$ (KCP) type are also the typical representatives of mixed-valence quasi-one-dimensional complexes, as are phthalocyanines and porphyrins. Moreover, pure inorganic compounds, such as $NbSe_3$, are also interesting examples of compounds with quasi-one-dimensional structure.

The molecular composite includes a quasi-one-dimensional—or at least structurally and electrically anisotropic—molecular matrix, wherein ionic complexes are distributed in the matrix. Polyconjugated compounds, such as the exemplary quasi-one-dimensional systems described above, for example, polyphenylacetylene, can be used as the anisotropic molecular matrix. The ionic complex can be a salt, such as sodium chloride (NaCl), or any other material that can dissociate in an applied electric field. The exemplary anisotropic molecular matrix is depicted in FIGS. 3a–d as consisting of an assembly of chain-like molecules oriented perpendicular to the electrode surfaces. However, other orientations of those molecules or of anisotropic "channels" are possible as long as a charge separation of the type depicted in FIGS. 3a–d is enabled.

While not being bound by theory, the following is currently believed by the inventors to describe the mechanism for the conductivity change of the molecular composite material. Electric switching in the molecular thin films depicted in FIGS. 3a–d is characterized by the existence of two stable states, a high impedance state ("off" state) and a low impedance state ("on" state). The impedance of this "off" state is usually more than ~10 MΩ. Switching from the "off" state to the "on" state occurs when an applied electric field exceeds a threshold value. The impedance of this "on" state is less than ~100 Ω. A transition from "on" state back to the "off" state takes place when the polarity of the electric field is reversed.

Figure 3:
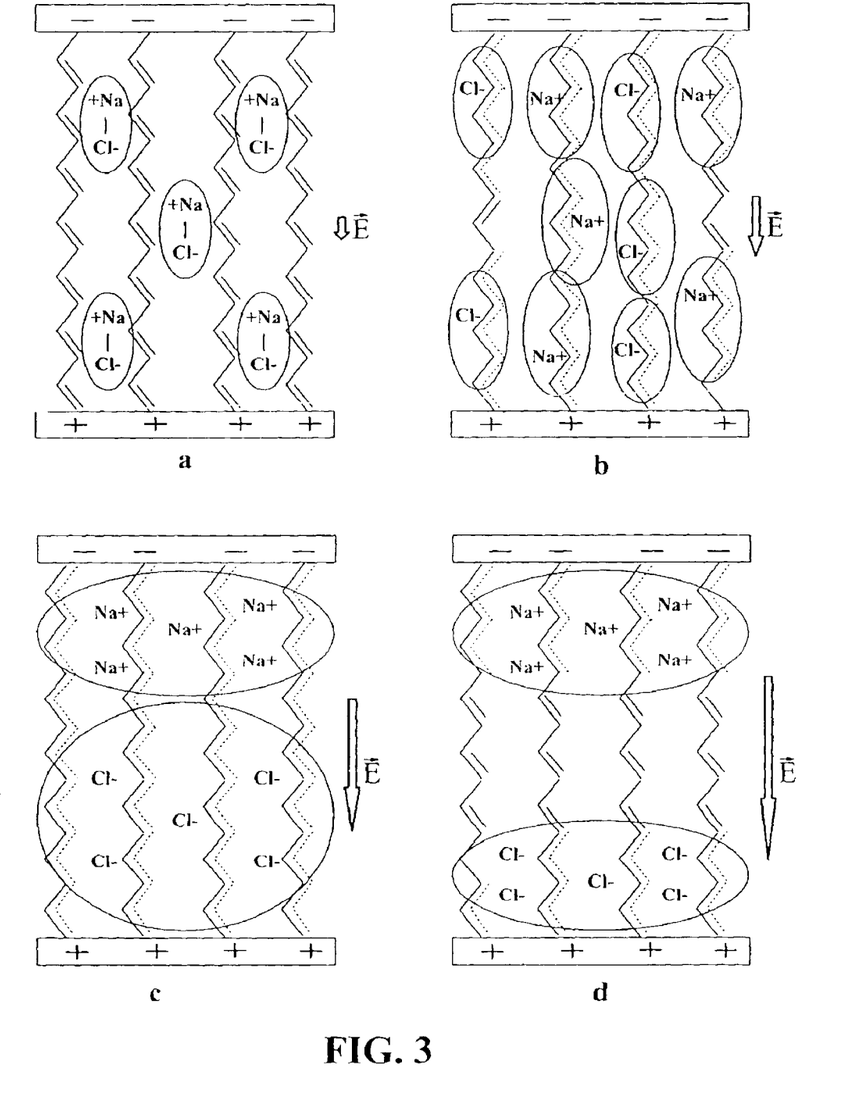
FIGS. 3a–3d provide a schematic depiction of a molecular composite interconnect structure in various operational states, in accordance with embodiments of the present invention.

Two modes of the two-terminal device operation can be identified: a metastable mode (FIG. 3b) and a stable mode (FIG. 3c). The stable mode of the two-terminal device operation shows the high $P_W$ and $P_{ER}$ value (3–10V), low impedance of the "ON" state (less than 100 Ω), long switching time (1 ms and more) and long storage time (more than two month). Conversely, the metastable mode of the two-terminal device is characterized by the low $P_W$ and $P_{ER}$ value (0.1–0.5V), high impedance of the "ON" state (wide region, about 1 kΩ–1 MΩ), short switching time (less than 1 μs a, and short storage time (between about 10 s or several hours. Some memory cells exhibit substantially unchanged electrical properties after storage for six years.

FIG. 3a illustrates the "off" state, where the electrical conductivity is essentially zero, assuming that the anisotropic molecular matrix itself is a good electrical insulator. When an external electric field E is applied, as indicated in FIG. 3b, the sodium salt dissociates into sodium and chlorine ions, and the ions are displaced from their original position in the anisotropic molecular matrix, resulting in an increase in the electrical conductivity of the two-terminal device ("on" state) to the metastable state. Upon further increase of the electric field, the ions become more strongly separated (FIG. 3c), accompanied by a still further increase in the conductivity of the two-terminal device, which attains the above-described stable state. When a very large field is applied over a long time, the anions and cations accumulate at the electrodes (FIG. 3d), resulting in a sharp decrease in the electrical conductivity of the two-terminal device due to the absence of mobile charges ("off" state).

Figure 4:
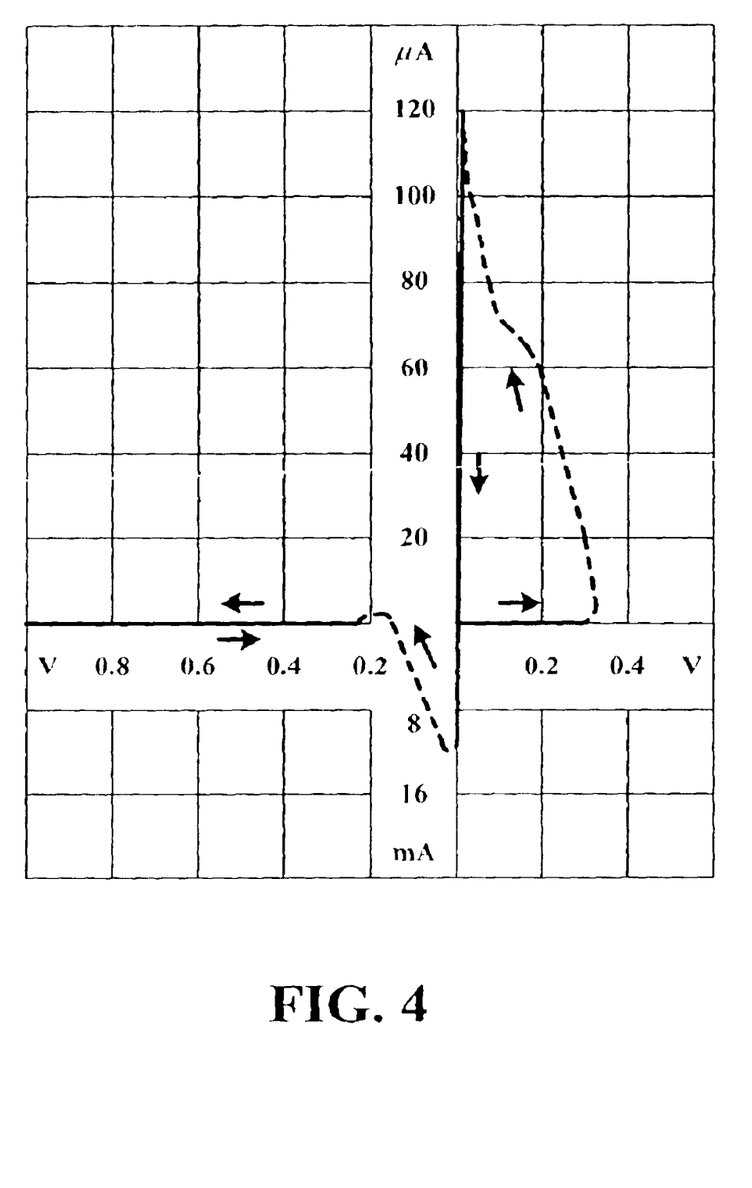
FIG. 4 shows a voltage-current characteristic for write and erase operation.

FIG. 4 shows a typical I–V curve for write (positive applied voltage) and erase operation (negative applied voltage), with the voltage applied, for example, between the layers 13 and 16 of FIG. 1. The memory cell is in the "off" state, until the applied voltage, in the described example, reaches a critical value of approximately 0.3 V. The write voltage depends on the parameters used during the write process, as described further below. In the "off" state, the electric current through the memory cell is essentially zero. When the applied voltage exceeds the critical voltage, the resistance of the approaches zero memory cell, with the voltage across the cell dropping and the current increasing to more than 120 μA, indicating a switch of the device to a low-resistance state. The cell is then in the "on" state where it remains until a negative (reverse) voltage is applied, which in the present example is approximately –1 V. This represents the erase cycle. After the erase cycle is completed, the cell is again in the "off" state.

Figure 5:
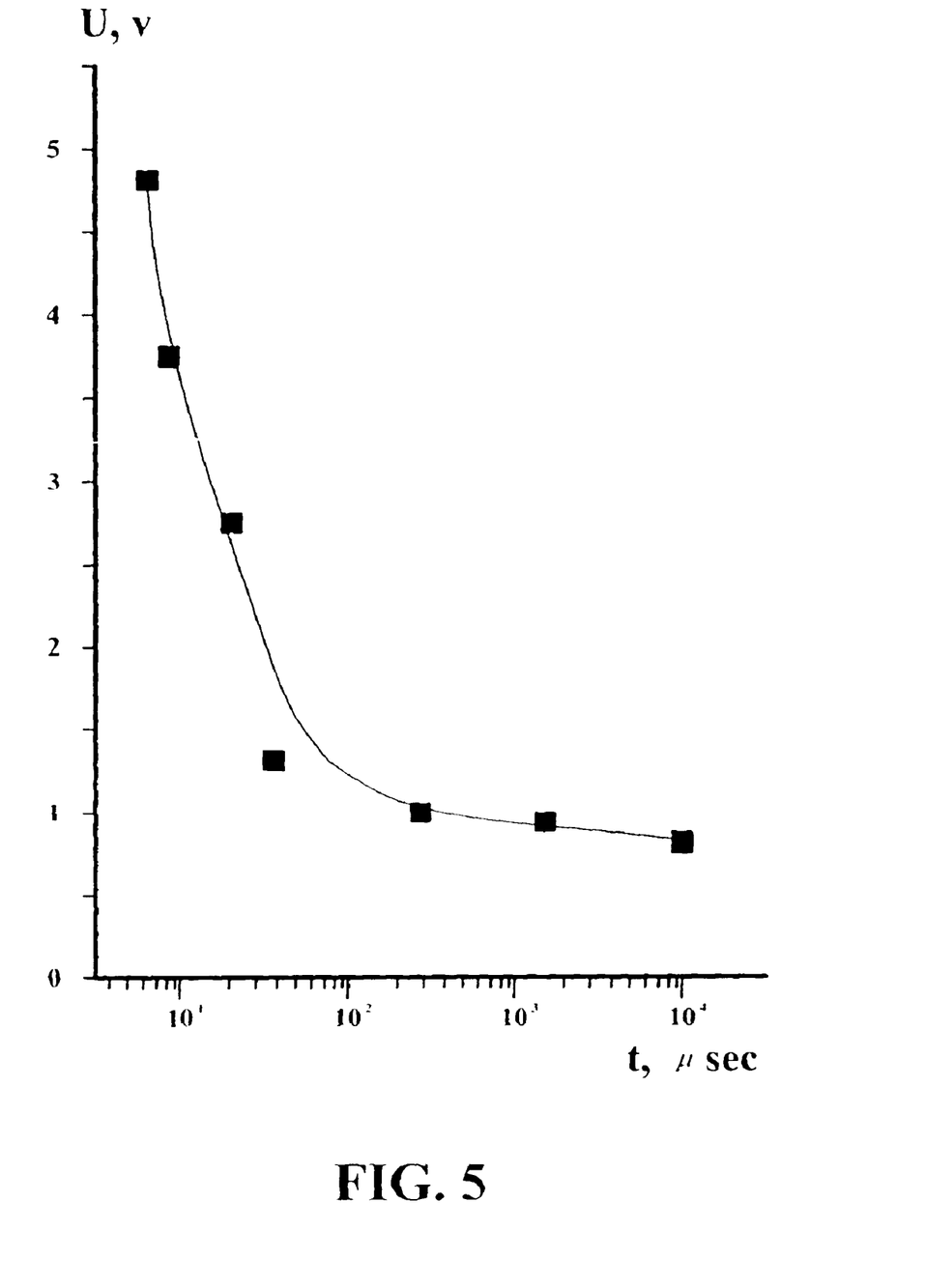
FIG. 5 shows a dependence of writing pulse critical amplitude on writing pulse time.

Referring now to FIG. 5, the pulse duration of a write pulse required to write information in the two-terminal element is related to the amplitude of the write pulse. For example, the element may be switched from the "off" state to the "on" state by applying a pulse of 4 V over a period of 10 μs, or by applying a pulse of approximately 1 V over a period in excess of 1 ms. Accordingly, the write voltage and write speed of the element can be adapted to specific applications.

The present invention thus provides interconnect structure and integrated circuit devices that employ a molecular composite material that has a reversibly programmable resistance. This creates interconnects that can be programmed and re-programmed between conductive and non-conductive, overcoming limitations of fuses and anti-fuses and increasing flexibility for circuit designers.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A semiconductor device, comprising:
   a first electrical contact;
   a second electrical contact;
   an interconnect between the first and second electrical contacts, the interconnect comprises a molecular matrix with ionic complexes distributed there through and has a reversibly programmable resistance and extends into a via hole to connect the first electrical contact and the second electrical contact; and
   wherein the ionic complexes are dissociable in the molecular matrix under the influence of an appiled electrical field.

2. The device of claim 1, wherein the molecular matrix comprises a polyconjugated compound.

3. The device of claim 2, wherein the polyconjugated compound is one of: polyparaphenylene; polyphenylvinylene; polyaniline, polythiophene, or polypyrrole.

4. The device of claim 1, wherein the molecular matrix comprises aromatic and heterocyclic molecules.

5. The device of claim 1, wherein the molecular matrix comprises a quasi-one-dimensional complex.

6. The device of claim 5, wherein the quasi-one-dimensional complex is a polymeric phtalocyanine.

7. The device of claim 5, wherein the quasi-one-dimensional complex is a polymeric porphyrin.

8. The device of claim 1, wherein the molecular matrix is an anisotropic inorganic material.

9. The device of claim 8, wherein the anisotropic inorganic material is $NbSe_3$.

10. The device of claim 1, wherein the molecular matrix is a molecular compound of $(TMTSF)_2X$.

11. The device of claim 1, wherein the molecular matrix is a transition metal salt of $K_2Pt(CN)_4Br_{03}$ x $3H_2O$ (KCP) type.

12. A programmable interconnect structure comprising:
    first and second electrical contacts; and
    an interconnect between the first and second electrical contacts that extends into a via to selectively permit contact between the first and second electrical contacts and comprises a single layer of material that has a reversibly programmable resistivity, the material comprising a molecular matrix with ionic complexes distributed throughout the molecular matrix, wherein the ionic complexes are dissociable in the molecular matrix under the influence of an applied field.

13. The structure of claim 12, wherein the molecular matrix comprises a polyconjugated compound.

14. The structure of claim 13, wherein the polyconjugated compound is one of: polyparaphenylene; polyphenylvinylene; polyaniline; polythiophene; or polypyrrole.

15. The structure of claim 12, wherein the molecular matrix comprises aromatic and heterocyclic molecules.

16. The structure of claim 12, wherein the molecular matrix comprises a quasi-one-dimensional complex.

17. The structure of claim 16, wherein the quasi-one-dimensional complex is a polymeric phtalocyanine.

18. The structure of claim 16, wherein the quasi-one-dimensional complex is a polymeric porphyrin.

19. The structure of claim 12, wherein the molecular matrix is an anisotropic inorganic material.

20. The structure of claim 19, wherein the anisotropic inorganic material is $NbSe_3$.

21. The structure of claim 12, wherein the molecular matrix is a molecular compound of $(TMTSF)_2X$.

22. The structure of claim 12, wherein the molecular matrix is a transition metal salt of $K_2Pt(CN)_4Br_{03} \times 3H_2O$ (KCP) type.

* * * * *